United States Patent
Walker et al.

(10) Patent No.: US 7,271,610 B2
(45) Date of Patent: Sep. 18, 2007

(54) USING A PARAMETRIC MEASUREMENT UNIT TO SENSE A VOLTAGE AT A DEVICE UNDER TEST

(75) Inventors: Ernest Walker, Weston, MA (US); Ron Sartschev, Dunstable, MA (US)

(73) Assignee: Teradyne, Inc., North Reading, MA (US)

( * ) Notice: Subject to any disclaimer, the term of this patent is extended or adjusted under 35 U.S.C. 154(b) by 0 days.

(21) Appl. No.: 11/016,354

(22) Filed: Dec. 17, 2004

(65) Prior Publication Data

US 2006/0132164 A1 Jun. 22, 2006

(51) Int. Cl.
*G01R 31/28* (2006.01)
(52) U.S. Cl. .................... 324/765; 324/158.1
(58) Field of Classification Search ................. None
See application file for complete search history.

(56) References Cited

U.S. PATENT DOCUMENTS

| | | | |
|---|---|---|---|
| 4,998,026 A | 3/1991 | King | |
| 5,101,153 A * | 3/1992 | Morong, III | 324/537 |
| 5,200,696 A | 4/1993 | Menis et al. | |
| 5,514,976 A | 5/1996 | Ohmura | |
| 5,521,493 A | 5/1996 | Persons | |
| 5,617,035 A * | 4/1997 | Swapp | 324/711 |
| 5,754,041 A | 5/1998 | Kaito et al. | |
| 5,917,331 A * | 6/1999 | Persons | 324/765 |
| 6,498,473 B1 | 12/2002 | Yamabe | |
| 6,677,775 B2 | 1/2004 | Babcock | |
| 6,687,868 B1 | 2/2004 | Furukawa et al. | |
| 6,828,775 B2 * | 12/2004 | Chow et al. | 324/158.1 |
| 6,836,136 B2 | 12/2004 | Aghaeepour | |
| 6,859,902 B1 | 2/2005 | Dalal et al. | |
| 6,879,175 B2 | 4/2005 | Conner | |
| 6,885,213 B2 * | 4/2005 | Sunter | 324/765 |
| 2005/0189950 A1 | 9/2005 | Lu | |

OTHER PUBLICATIONS

Mercury, System on a Chip, 50 MHz Octal Pin Electronics with PMU; Planet ATE; Nov. 22, 2004.
Neptune, SOC Pin Electronics Companion PMU/DAC/Resistive Load; Planet ATE; Jun. 16, 2004.
Pluto, Octal PMU/VI with Ganging 5 MHz Pin Electronics; Planet ATE; Oct. 28, 2004.
Saturn, System on a Chip, Dual Channel Wide Voltage Pin Electronics Solution; Planet ATE; Jul. 19, 2005.
Venus, System on a Chip, Dual Channel 133 MHz Pin Electronics Solution; Planet ATE; Sep. 16, 2004.

* cited by examiner

*Primary Examiner*—Ernest Karlsen
(74) *Attorney, Agent, or Firm*—Fish & Richardson P.C.

(57) ABSTRACT

Circuitry for use in testing a device includes a first measurement unit to apply a forced voltage to the device, and a second measurement unit having functionality that is disabled. The second measurement unit includes a sense path to receive a sensed voltage from the device, where the sense path connects to the first measurement unit through the second measurement unit. The first measurement unit adjusts the forced voltage based on the sensed voltage.

11 Claims, 5 Drawing Sheets

USING A PARAMETRIC MEASUREMENT UNIT TO SENSE A VOLTAGE AT A DEVICE UNDER TEST

TECHNICAL FIELD

This patent application relates generally to testing a device and, more particularly, to using a parametric measurement unit to sense a voltage at the device.

BACKGROUND

Automatic test equipment (ATE) refers to an automated, usually computer-driven, approach to testing devices, such as semiconductors, electronic circuits, and printed circuit board assemblies. A parametric measurement unit (PMU) is typically part of an ATE. A PMU is used during device testing to measure parameters, such as voltage and current, at a device pin, and to regulate those parameters. The PMU attempts to ensure that, during testing, proper parameter values are applied to the device under test (DUT).

A PMU typically includes circuitry for forcing a voltage and/or current to the DUT. Impedance (e.g., resistance) in a circuit path leading from this circuitry to the DUT can result in a voltage drop. This voltage drop reduces the amount of voltage that is applied to the DUT. Heretofore, PMUs were relatively low-current devices, e.g., on the order of 2 mA or less, making the voltage drop in the circuit path leading to the DUT relatively insignificant. However, with the advent of higher-current PMUs, e.g., on the order of 50 mA, the voltage drop on the circuit path to the DUT has become fairly significant. When the voltage drop is sufficiently high, as is often the case for higher-current PMUs, it can prevent the DUT from performing properly during testing, leading to inaccurate test results.

SUMMARY

This patent application describes methods and apparatus, including computer program products, for using a PMU to sense a voltage at a DUT.

In general, in one aspect, the invention is directed to circuitry for use in testing a device. The circuitry includes a first measurement unit to apply a forced voltage to the device and a second measurement unit having functionality that is disabled. The second measurement unit includes a sense path to receive a sensed voltage from the device. The sense path connects to the first measurement unit through the second measurement unit. The first measurement unit adjusts the forced voltage based on the sensed voltage. Because the sense path is from the device, the sense path is able to take into account voltage drops that occur on circuit paths right up to a point of connection to the device. These voltage drops may be accounted for, e.g., compensated for, by adjusting the forced voltage.

The foregoing aspect may include one or more of the following features. The first measurement unit may be substantially identical to the second measurement unit. The functionality that is disabled in the second measurement unit may be an ability to apply forced voltage to the device. The second measurement unit may include a driver that is tri-stated to disable the functionality. The sense path in the second measurement unit may be a high-impedance path on which substantially no voltage drop occurs.

The first measurement unit may include a driver to provide the forced voltage, and an output path over which the forced voltage is applied to the device. The output path may have an impedance that produces a voltage drop. The first measurement unit may adjust the forced voltage to substantially compensate for this voltage drop. The output path of the first measurement unit may correspond to the sense path of the second measurement unit. The first measurement unit may include a feedback path to sense a voltage drop that is between the driver and the device. The sense path may include a circuit path through the second measurement unit.

In general, in another aspect, the invention is directed to a method of testing a device. The method includes applying a first voltage to the device, and sensing a second voltage at the device. The second voltage corresponds to a difference between the first voltage and a voltage drop experienced as a result of applying the first voltage to the device. The method also includes adjusting the first voltage in accordance with the second voltage. In the method, applying and sensing are performed using a first device and a second device that are substantially identical in design.

The foregoing aspect may include one or more of the following features. The first device and the second device may be first and second PMUs, respectively. Sensing the second voltage may include configuring the second PMU to act as a sense path over which the second voltage is sensed. The second PMU may be configured by controlling circuitry in the second PMU to effect connections between circuit paths. The second voltage may correspond to a voltage at a pin of the device.

In general, in another aspect, the invention is directed to ATE for use with a DUT. The ATE includes plural PMUs for use in regulating voltages applied to the DUT. The plural PMUs include a first PMU configured to force a voltage to the DUT, and a second PMU configured to provide a sense path for the first PMU. The second PMU has substantially a same structure as the first PMU. This aspect of the invention may also include one or more of the following features.

The plural PMUs may include a third PMU configured to force a voltage to the DUT, and a fourth PMU configured to provide a sense path for the third PMU, The fourth PMU has substantially a same structure as the third PMU, the second PMU, and the first PMU. The first, second, third and fourth PMUs may be implemented in hardware only, or using a combination of hardware and software. The second PMU may be tri-stated to disable functionality to force voltage to the DUT.

The sense path through the second PMU may tap a sense voltage at the DUT. This sense voltage may be applied from the sense path to the first PMU. The first PMU may include a driver. The sense voltage may be applied to the driver and the driver may regulate the voltage to the DUT in accordance with the sense voltage.

The details of one or more examples are set forth in the accompanying drawings and the description below. Further features, aspects, and advantages of the invention will become apparent from the description, the drawings, and the claims.

DETAILED DESCRIPTION

Figure 1:
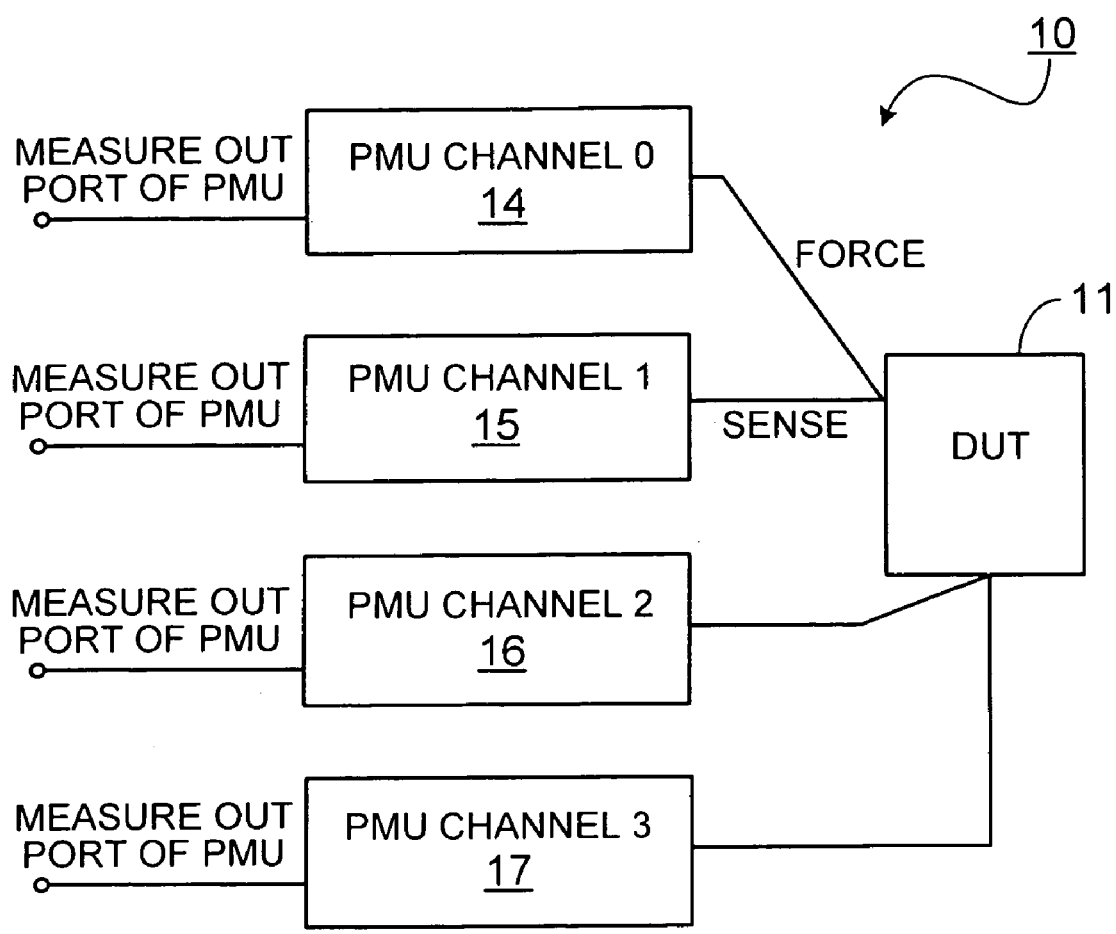
FIG. 1 is a block diagram of PMUs in an ATE.

FIG. 1 is a block diagram of ATE 10 for testing a DUT 11. As shown in FIG. 1, ATE 10 includes four PMUs 14 to 17, which correspond to four testing channels. One function of PMUs 14 to 17 is to test direct current (DC) parameters, including voltage and current, at the DUT. PMUs 14 to 17 may also function as a power source for DUT 11. That is, the current outputs of two or more of PMUs 14 to 17 may be applied to a power pin of DUT 11, thereby powering DUT 11 during testing.

PMUs 14 to 17 have substantially identical structures, meaning that they contain basically the same circuit elements, although those circuit elements may be configured differently. As such, only one PMU is described in detail.

Figure 2:
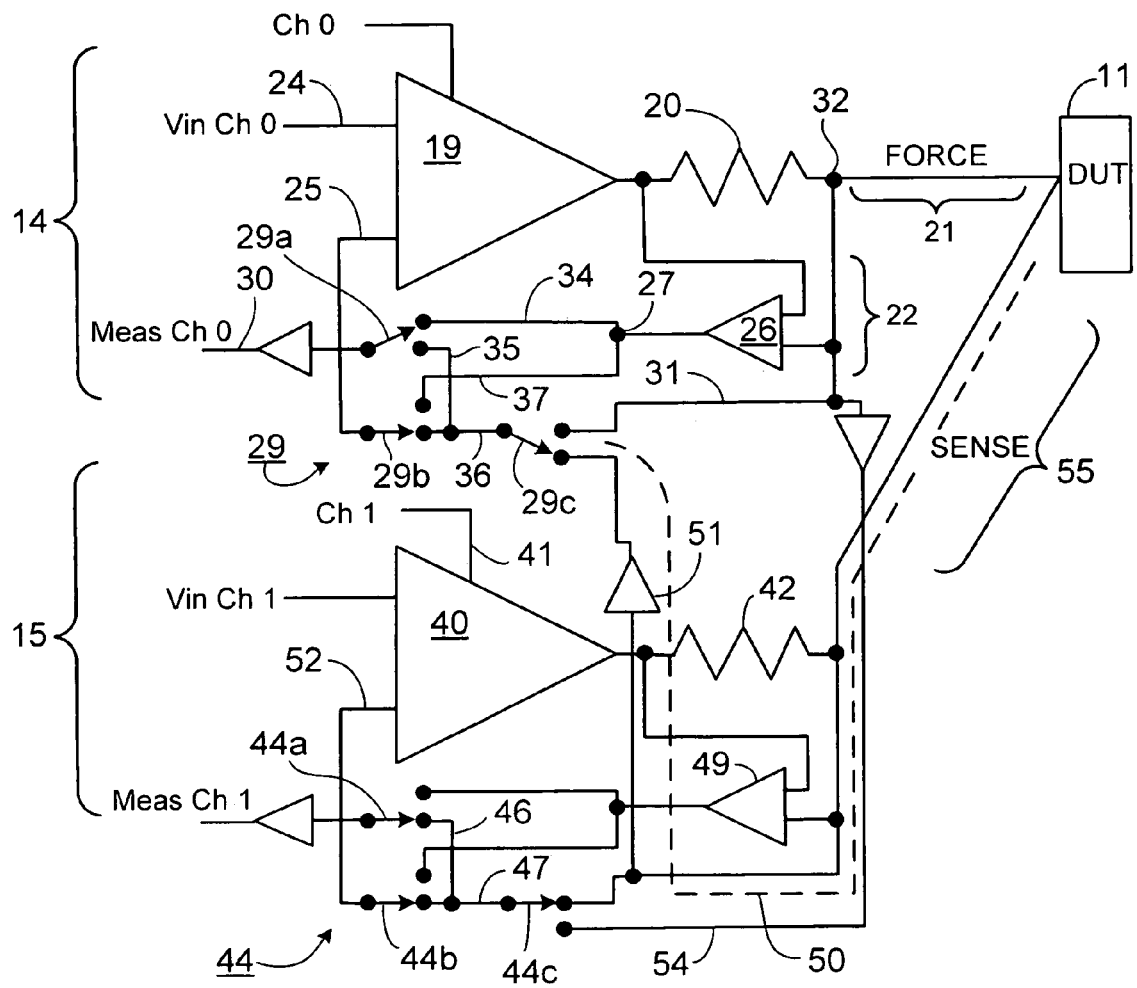
FIG. 2 is a circuit diagram showing two of the PMUs of FIG. 1.

FIG. 2 is a circuit diagram showing one embodiment of PMUs 14 and 15 (referred to herein in as first PMU 14 and second PMU 15). As shown in FIG. 2, first PMU 14 contains a driver 19, a resistor 20, a circuit path 21 to DUT 11, and a feedback path 22.

Driver 19 may be an op-amp or similar device that receives voltages and that outputs (or "forces") a voltage or current to DUT 11 via resistor 20 and circuit path 21. In the "force voltage" mode, driver 19 regulates the voltage output of first PMU 14; and in the "force current" mode, driver 19 regulates the current output of first PMU 14. In both the force voltage and the force current mode, however, a current is output from driver 19.

In this embodiment, first PMU 14 is a high-current device, meaning that driver 19 outputs currents on the order of 50 mA (although PMU 14 may also operate at lower currents). Driver 19 contains two inputs 24 and 25. In this example, first input 24 is for receiving an input voltage, $V_{in}$, from an external source (not shown) and second input 25 is for receiving a sense voltage (described below). Driver 19 regulates its output voltage and current based on a difference between $V_{in}$ and the sense voltage.

Resistor 20 is in the output path of driver 19, and is used in conjunction with feedback path 22 to measure the current output of driver 19. More specifically, the voltage across resistor 20 is measured via a differential amplifier 26 in feedback path 22. The measured voltage is output at point 27. From there, switches 29 (described below) are configured to output the voltage to port 30. Circuitry within the ATE that is external to the PMUs (not shown) knows the resistance of resistor 20 and, by virtue of differential amplifier 26, the voltage drop across resistor 20. From this information, the external circuitry is able to determine the current output of driver 19.

Feedback path 22 also includes voltage sense path 31. Voltage sense path 31 is used to sense the voltage at a point 32 in PMU 14 that is prior to circuit path 21. That is, the voltage at point 32 feeds back to the input 25 of driver 19 when switches 29 are configured appropriately. Through input 25, driver 19 is able to take into account the voltage drop that occurred up to point 32 and to compensate its output for that voltage drop, e.g., to increase its output voltage to compensate for the voltage drop. However, because point 32 is prior to circuit path 21, the voltage drop that occurs over circuit path 21 is not compensated for by feedback path 22. A way of compensating for this voltage drop using the existing PMUs is described below.

In PMU 14, each of switches 29 may be implemented by any electrical and/or mechanical mechanisms that are capable of making the appropriate connections between circuit paths. In this embodiment, switches 29 include switch 29a, switch 29b, and switch 29c. Switch 29a connects between circuit paths 34 and 35; switch 29b connects between circuit paths 36 and 37; and switch 29c connects between circuit paths 50 and 31. When connected to path 34 (the configuration shown in first PMU 14), switch 29a connects the output of amplifier 26 (the "current feedback path") to port 30. This is referred to as the current sense configuration, since it is the switch configuration that enables first PMU 14 to provide an indication that is used to measure the current output of driver 19. The current feedback path is so named because its output (i.e., the voltage output of amplifier 26) is used to determine a current through resistor 20.

Switches 29 may also be configured to define voltage sense configurations. In a first voltage sense configuration, switch 29b is connected to path 36 (the configuration shown in first PMU 14), switch 29c is connected to path 31, and switch 29a is connected to path 35. In this configuration, path 31 (the "voltage feedback path") is drawn to the voltage of point 32, which is passed both to input 25 of driver 19 and to port 30 (via switches 29). As noted above, the voltage at point 32 takes into account the voltage drop of resistor 20, but does not account for the voltage drop resulting from the impedance of circuit path 21.

As shown in FIG. 2, circuit path 21 extends from point 32 to DUT 11. In this embodiment, circuit path 21 has an impedance of about 1Ω to 4Ω (in other embodiments, the impedance along circuit path 21 may be more or less than this). This impedance reduces the voltage that amplifier 19 applies to DUT 11. That is, the current from driver 19 passes through circuit path 21, whose impedance causes a voltage drop, which results in a decrease in the voltage applied to DUT 11. For a 50 mA current, the voltage drop is about 50 mV to 200 mV, which can have a significant adverse affect on the testing of DUT 11. To account for, and thus compensate for, the voltage drop of circuit path 21, second PMU 15 is configured to act as a sense path. In this configuration, some functionality of second PMU 15 is disabled in order to ensure that second PMU 15 does not perform PMU functions.

More specifically, driver 40 of second PMU 15 is tri-stated to prevent driver 40 from outputting current and/or voltage to DUT 11. In this regard, a tri-state circuit, such as driver 40, is similar to an ordinary circuit, except that it has an additional input 41 called the "enable" input. When the enable input is "1", the tri-state circuit behaves like a corresponding normal (non-tri-state) circuit. When the enable input is "0", the output of the tri-state circuit (in this case, driver 40) is disconnected from the rest of the circuit. Thus, as here, when driver 40 is tri-stated, its output is disconnected from resistor 42, preventing driver 40 from supplying current and/or voltage to DUT 11.

When driver 40 is tri-stated, second PMU 15 may be configured to act as a sense path for DUT 11. Circuitry (not shown) configures second PMU 15 via one or more control signals applied to switches 44. When second PMU 15 is so configured, switches 44a and 44b are connected to circuit paths 46 and 47, respectively, so as to produce an open circuit at the output of amplifier 49. Switch 44c may be connected to circuit path 50 (shown) or switch 44c may be disconnected from circuit path 50. Circuit path 50 acts as a sense path directly from DUT 11 to first PMU 14. That is, circuit path 50 taps into the voltage at the DUT pin that received forced voltage from first PMU 14. Circuit path 50 has a relatively high impedance and, in its sensing capacity, does not draw significant amounts of current. As a result, there is relatively little voltage drop along circuit path 50. The voltage along circuit path 50 thus substantially corresponds to the voltage at DUT 11.

First PMU 14 taps the voltage of the DUT sense path (i.e., circuit path 50) via switches 29b and 29c. That is, switches 29b and 29c are configured (as shown in first PMU 14) to connect circuit path 50 to the input 25 of driver 19 (switch 29a may also be configured to connect to port 30 and thereby output the DUT voltage at port 30). In this way, the voltage from DUT 11 is applied to input 25 of driver 19. Accordingly, driver 19 can adjust its output to compensate for the voltage drop that occurred in circuit path 21 (in addition to any voltage drop prior to point 32). As shown in FIG. 2, a voltage amplifier 51 may be provided in circuit path 50 to buffer signals.

Figure 3:
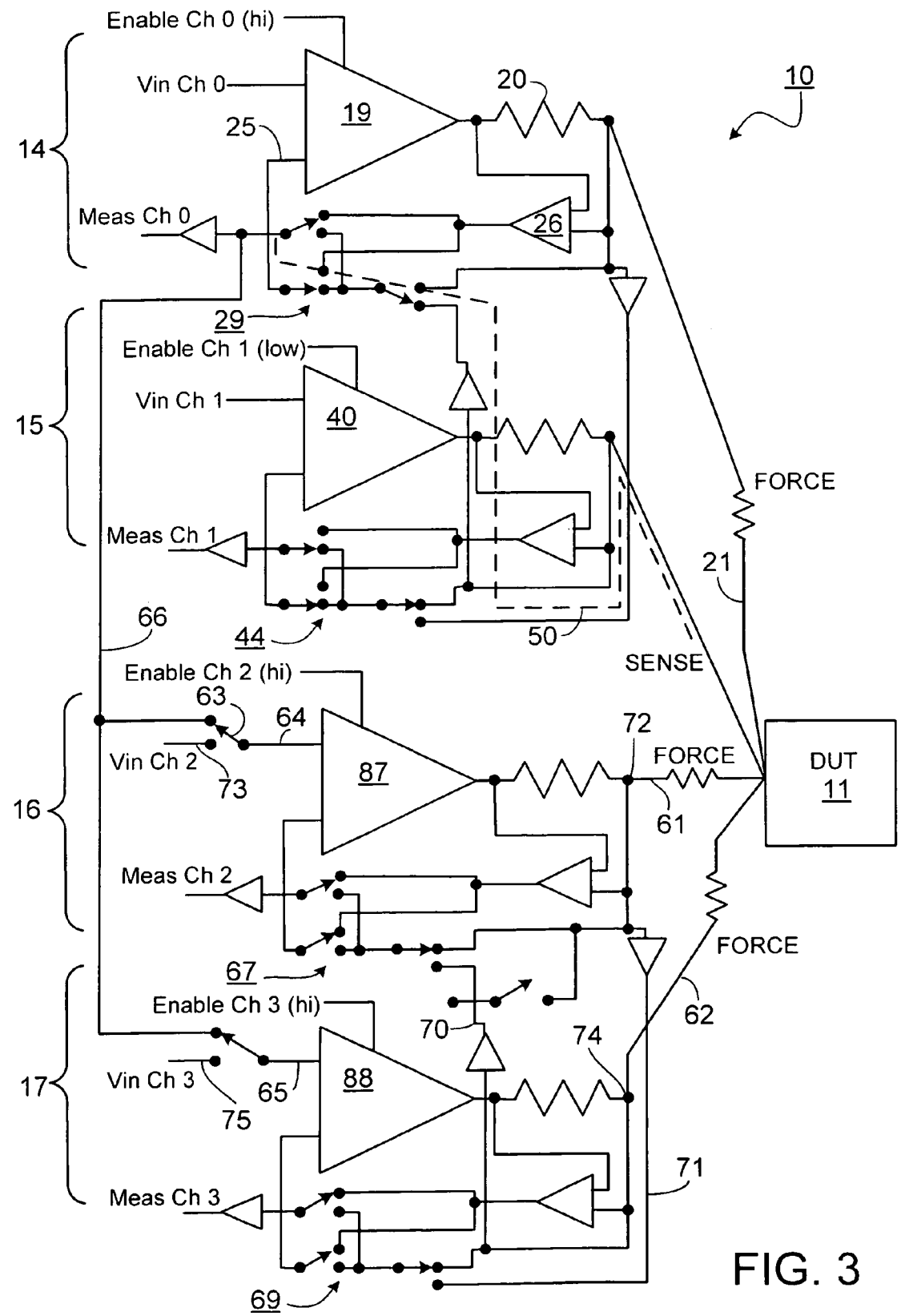
FIG. 3 is a circuit diagram showing the PMUs of FIG. 1 powering the DUT.

In addition to the foregoing, PMUs 14 to 17 may be operated together as a current source to power DUT 11 during testing. FIG. 3 is a circuit diagram showing PMUs 14 to 17 configured to power DUT 11. In this configuration, PMU 14 is in force voltage mode, and PMUs 16 and 17 are in force current mode. In this configuration, current is provided to DUT 11 via output circuit path 21 of first PMU 14, via output circuit path 61 of third PMU 16, and via output circuit path 62 of fourth PMU 17. The currents from the PMUs are supplied to a power pin on DUT 11, where they are combined and used to power DUT 11.

The current from each PMU is supplied to DUT 11 in the manner described above. In the embodiment of FIG. 3, second PMU 15 is configured to provide a voltage sense line for DUT 11, as described above. This is done to maintain the voltage at the power pin at about a predetermined level. If voltage stability at the power pin is not a substantial concern, second PMU 15 may also be used to supply current to the power pin of DUT 111 (i.e., second PMU 15 may not be configured to act as the voltage sense path).

In the embodiment of FIG. 3, circuit path 50 (the DUT sense path) feeds the voltage at DUT 11 back to driver 19, as described above. Amplifier 26 in PMU 14 is used to measure the current in resistor 20 at the output of driver 19, and to convert this current into a voltage. The resulting output voltage is also applied to the input 64 of PMU 16 and the input 65 of PMU 17 via circuit path 66. Thus, the current in the main force PMU 14 is mirrored in PMU's 16 and 17. One or more amplifiers (not shown) may be placed along circuit path 66 to buffer signals applied to inputs 64 and 65. Switches 67 and 69 of PMUs 16 and 17 are configured to disconnect sense paths 70 and 71, and to permit driver current regulation through feedback from points 72 and 74, as described above.

Control circuitry (not shown) may be used to connect PMUs 14 to 17 in the configuration shown in FIG. 3. For example, this control circuitry may control switches 63 and 68 of PMUs 16 and 17 to connect to circuit path 66 rather than to voltage inputs 73 and 75, which are counterparts to $V_{in}$ in PMU 14. As was the case above, switches 63 and 68 may be implemented by any electrical and/or mechanical mechanisms that may be used to make the appropriate connections between circuit paths.

In the embodiment of FIG. 3, PMUs 14, 16 and 17 are each connected to a single power pin on DUT 11. The current from each PMU thus augments the total current supplied to the power pin. So, for example, if each of PMUs 14, 16 and 17 is capable of supplying 50 mA, the aggregate current supplied to the power pin is 150 mA. The amount of current that is supplied to the power pins depends on a number of factors, including the amount of current that each PMU is capable of supplying and the number of PMUs available to supply current. For example, if PMU 15 were configured to supply current rather than to act as a sense path, then the total current that could be supplied to DUT 11 would be 200 mA. On the other hand, PMUs 14 and 15 may be needed for use with a non-power pin on DUT 11, leaving only PMUs 16 and 17 to supply power to the power pin.

In PMUs 16 and 17, switches 67 and 69 are configured, as shown, to connect their respective current feedback paths to drivers 87 and 88. Likewise, circuit path 66 is connected, as shown to the current feedback path of PMU 14. This configuration provides for relatively effective regulation of current output from the PMUs to DUT 11. That is, the amount of current output by each of PMUs 14, 16 and 17 is about the same.

Figure 4:
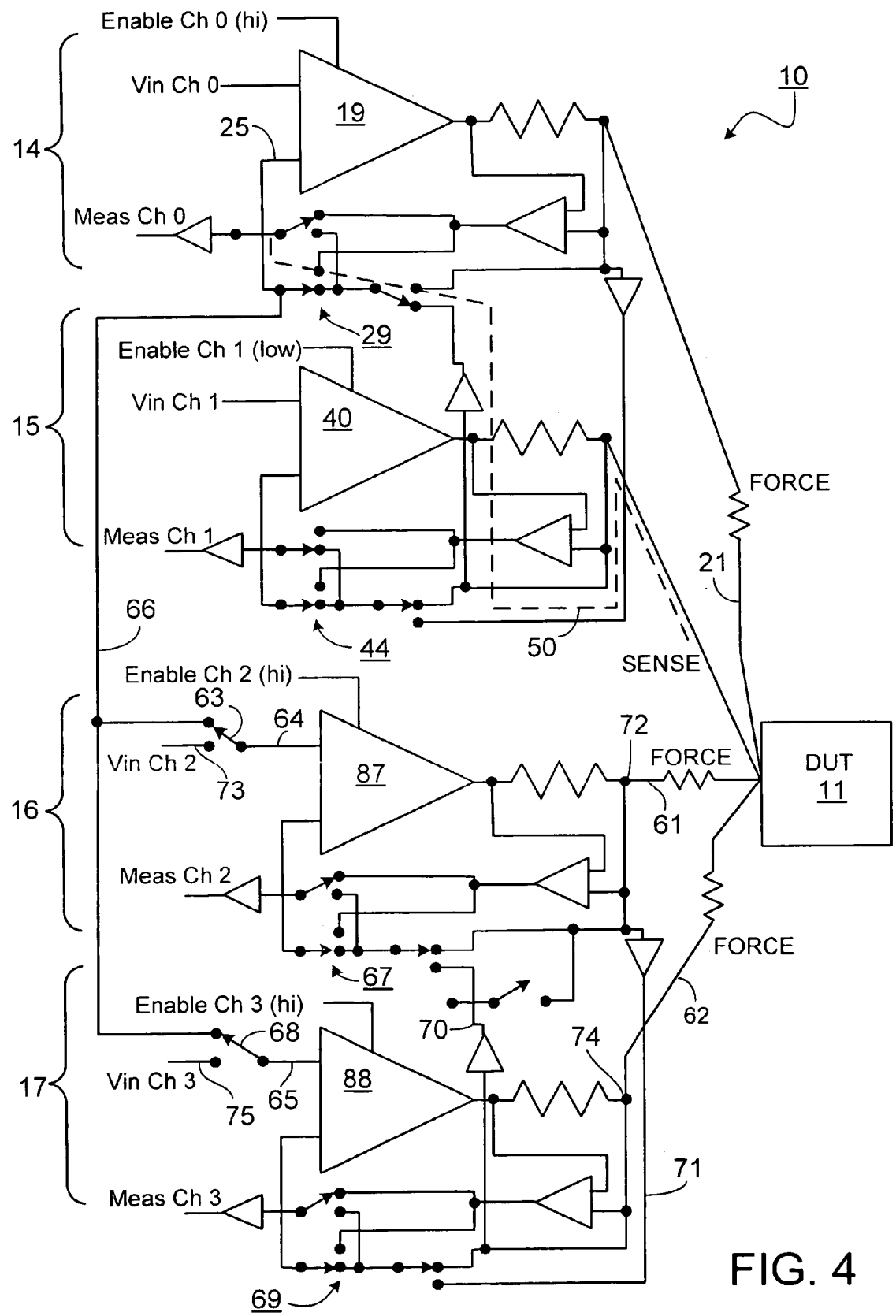
FIG. 4 is an alternate configuration of the circuit diagram shown in FIG. 3.

FIG. 4 shows an alternative configuration of the circuitry of FIG. 3. In this configuration, PMUs 14, 16 and 17 are all in force voltage mode. In the circuitry of FIG. 4, switches 67 and 69 connect the inputs of drivers 87 and 88 to their respective voltage feedback paths, and switches 29 connect circuit path 50, as shown. Circuit path 66 is also connected to the voltage feedback provided by circuit path 50. In this configuration, there may be variations in the amounts of current output by each of PMUs 14, 16 and 17.

It is noted that although only four PMUs are shown in FIG. 3, any number of PMUs may be implemented in an ATE, and may be used to supply power to a DUT.

In this embodiment, PMUs 14 to 16 are implemented on a single chip that is part of the ATE, and the ATE does not include a power supply other than PMUs 14 to 17. Eliminating a separate power supply on the ATE reduces the amount of circuit board space needed to implement the ATE and the cost required to produce the ATE.

Although FIGS. 2 to 4 show second PMU 15 being used as a sense path for first PMU 14, the ATE is not limited as such. That is, second PMU 15 may be configured to force voltage to DUT 11 and first PMU 14 may be configured to act as the sense path for second PMU 15. The functions of first and second PMUs 14 and 15 may changed by reconfiguring their switches 29 and 44 and connecting the feedback path of PMU 15 from DUT 11 to circuit path 66. Referring to FIG. 2, in this alternate configuration, driver 19 is tri-stated, switch 29a is connected to circuit path 35, and switch 29b is connected to current path 36. Switch 29c is connected to circuit path 31 to disconnect circuit path 50 from first PMU 14. Switch 44c is connected to circuit path 54, (the DUT sense line), and switch 44b is connected to apply the voltage therefrom to input 52 of driver 40. Thus, an input 52 of driver 40 receives a voltage from DUT 11, and driver 40 compensates for the voltage drop along circuit path 55 based on this voltage.

Instead of using second PMU 15 as a sense path, third PMU 16 and/or fourth PMU 17 may be used as the sense path. Third PMU 16 and fourth PMU 17 may be configured in the same manner as second PMU 15, described above.

The foregoing embodiments describe PMUs that are implemented using hardware only. In other embodiments, at least part of each of the PMUs may be implemented using software. For example, drivers 19 and 40 may be controlled by a software-based control process. In this example, software may be used to regulate the voltage that is output to DUT 11. That is, the software may receive a sense voltage and control the voltage output to circuit path 21 by first PMU 14 based on this received sense voltage. Thus, if 40V is desired at DUT 11, and the sensed voltage indicates a voltage drop of 80 mV, the software may control first PMU 14 to increase the voltage output to 40V plus 80 mV to compensate for the voltage drop across circuit path 21.

Figure 5:
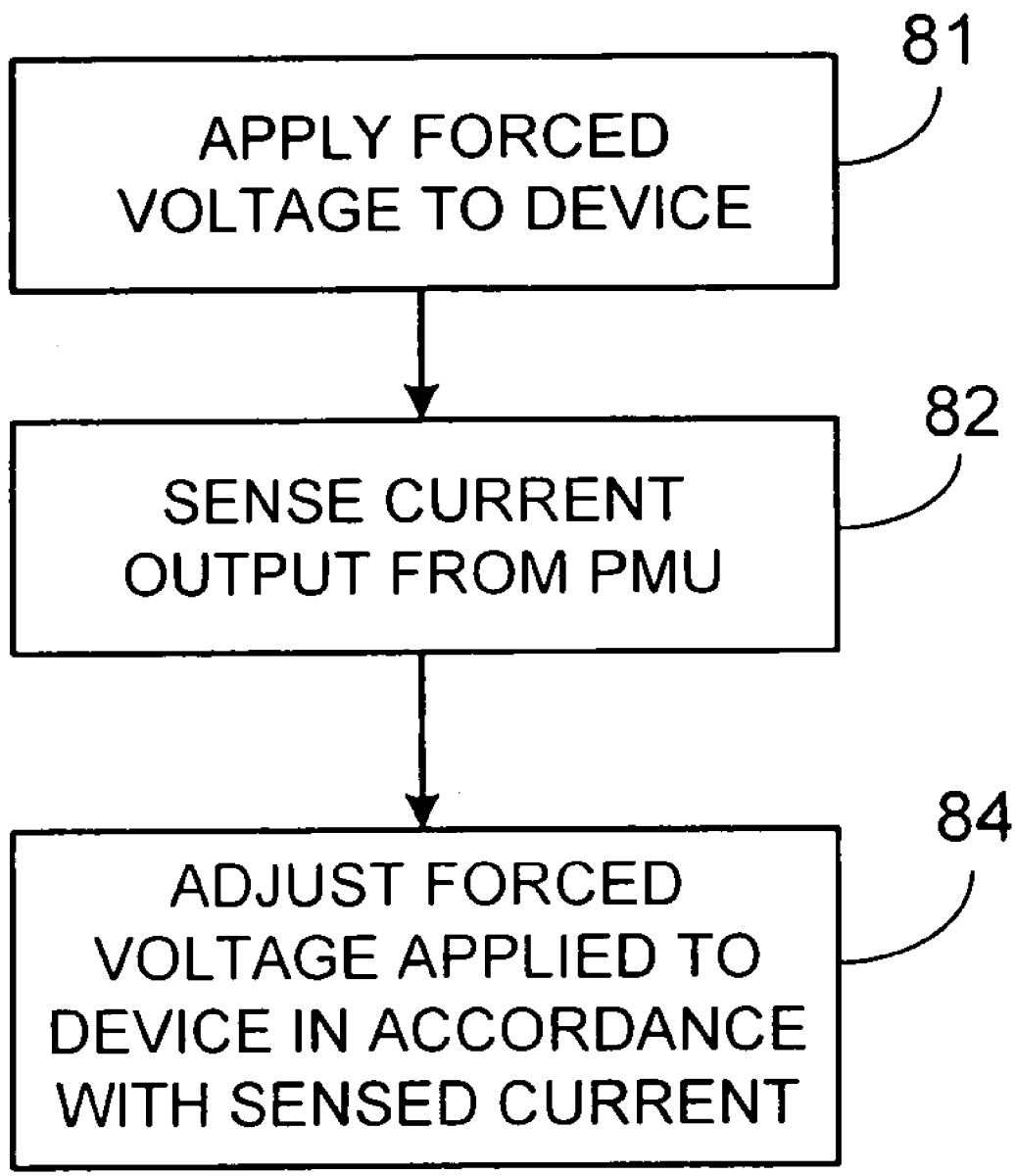
FIG. 5 is a flowchart showing a process for implementing the ATE using software to control voltage forcing and regulation Like reference numerals in different figures indicate like elements.

FIG. 5 is a flowchart showing a process 80 for implementing the ATE using software to control voltage forcing and regulation. Process 80 begins by applying (81) a first voltage to the device. This is done by forcing a voltage to DUT 11. The voltage may be forced by applying control signals to a voltage source, or by any other mechanism. The software knows an impedance of circuit path 21, e.g., the software may be programmed with that impedance beforehand. Process 80 senses (82) a current output of PMU 14 using the voltage from PMU 14's current feedback path. Process 40 adjusts (84) the input voltage applied to driver 19 to compensate for a voltage drop across circuit path 21. That is, process 40 determines the voltage drop based on the current output of driver 19 and the impedance of circuit path 21, and adjusts the driver input voltage accordingly.

The ATE described herein is not limited to use with the hardware and software described above. The ATE can be implemented in digital electronic circuitry, or in computer hardware, firmware, software, or in combinations thereof.

The ATE can be implemented, at least in part, via a computer program product, i.e., a computer program tangibly embodied in an information carrier, e.g., in a machine-readable storage device or in a propagated signal, for execution by, or to control the operation of, data processing apparatus, e.g., a programmable processor, a computer, or multiple computers. A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a communication network.

Method steps associated with implementing the ATE can be performed by one or more programmable processors executing one or more computer programs to perform the functions of the ATE. All or part of the ATE can be implemented as, special purpose logic circuitry, e.g., an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. Elements of a computer include a processor for executing instructions and one or more memory devices for storing instructions and data.

In the embodiments described above, amplifiers used to implement drivers and buffers may have a gain of one, although other gains may be used.

Elements of different embodiments described herein may be combined to form other embodiments not specifically set forth above. Other embodiments not specifically described herein are also within the scope of the following claims.

What is claimed is:

1. Circuitry for use in testing a device, comprising:
a first measurement unit that is capable of applying a forced signal to a pin on the device; and
a second measurement unit comprising circuitry that is substantially similar to circuitry in the first measurement unit but configured differently, the second measurement unit being configurable to provide a sense path to receive a sensed voltage from the pin on the device in response to the forced signal from the first measurement unit, the sense path connecting to the first measurement unit through a forced signal supply path of the second measurement unit;
wherein the first measurement unit is capable of adjusting the forced signal based on the sensed voltage.

2. The circuitry of claim 1, wherein, while the second measurement unit is configured to provide the sense path, functionality of the second measurement unit is disabled, the functionality comprising an ability to apply a forced signal to the device.

3. The circuitry of claim 2, wherein the second measurement unit comprises a driver that can be tri-stated to disable the functionality.

4. The circuitry of claim 1, wherein the sense path comprises a high-impedance path on which substantially no voltage drop occurs.

5. The circuitry of claim 1, wherein the first measurement unit comprises:
a driver to provide the forced signal; and
an output path over which the forced signal is applied to the device, the output path having an impedance that produces a voltage drop;
wherein the first measurement unit adjusts the forced signal to substantially compensate for the voltage drop.

6. The circuitry of claim 5, wherein the output path of the first measurement unit corresponds to the sense path of the second measurement unit.

7. The circuitry of claim 1, wherein the first measurement unit comprises:
a driver to provide the forced signal; and
a feedback path to sense a voltage drop that is between the driver and the device.

8. The circuitry of claim 1, wherein the sense path comprises a circuit path through the second measurement unit.

9. The circuitry of claim 1, wherein the forced signal comprises a forced voltage.

10. The circuitry of claim 1, further comprising:
a third measurement unit that is capable of applying a second forced signal to a second pin on the device; and
a fourth measurement unit comprising circuitry that is substantially similar to circuitry in the third measurement unit but configured differently, the fourth measurement unit being configurable to provide a second sense path to receive a second sensed voltage from the second pin on the device in response to the second forced signal from the third measurement unit, the second sense path connecting to the third measurement unit through the fourth measurement unit;
wherein the third measurement unit is capable of adjusting the second forced signal based on the second sensed voltage.

11. The circuitry of claim 1, further comprising:
a third measurement unit that acts as a current source for the device, the third measurement unit comprising circuitry that is substantially similar to circuitry in the first measurement unit and the second measurement unit.

* * * * *